(12) United States Patent
Piau et al.

(10) Patent No.: US 6,778,436 B2
(45) Date of Patent: Aug. 17, 2004

(54) APPARATUS AND ARCHITECTURE FOR A COMPACT FLASH MEMORY CONTROLLER

(76) Inventors: Fong Piau, 128-12-2 Menara UMNO, Jalan Macalister, 10400 Penang (MY); Ong Chun Huat, 128-12-2 Menara UMNO, Jalan Macalister, 10400 Penang (MY)

( * ) Notice: Subject to any disclaimer, the term of this patent is extended or adjusted under 35 U.S.C. 154(b) by 195 days.

(21) Appl. No.: 09/975,563

(22) Filed: Oct. 10, 2001

(65) Prior Publication Data

US 2003/0067814 A1 Apr. 10, 2003

(51) Int. Cl.[7] .............................................. G11C 16/04
(52) U.S. Cl. .............................. 365/185.03; 365/185.33
(58) Field of Search ........................ 365/185.03, 185.33, 365/230.03; 257/723

(56) References Cited

U.S. PATENT DOCUMENTS 6,125,061 A * 9/2000 Mitani ................... 365/185.33
6,363,009 B1 * 3/2002 Fukuzumi ............... 365/185.03
6,531,773 B2 * 3/2003 Nishizawa et al. ......... 257/723

* cited by examiner

Primary Examiner—Vu A. Le

(57) ABSTRACT

Disclosed herein is a flash memory controller that is incorporated in a flash memory. The flash memory controller allows the memory card to operate in either the PCMCIA mode, or true IDE mode. The controller is adapted to be able to selectively recall the data from the flash memory and transmit the data to one or more recipient devices via the PCMCIA type interface, or the true IDE interface, or by an alternate interface. The module incorporates a microcontroller that, when manipulated by the host device, induces the controller to send the data via the PCMCIA type interface, or the true IDE interface. In another embodiment, an alternate allows data stored in the flash memory to be transmitted via a number of specified input devices.

11 Claims, 4 Drawing Sheets

APPARATUS AND ARCHITECTURE FOR A COMPACT FLASH MEMORY CONTROLLER

BACKGROUND OF THE INVENTION

1. Field of the Invention

The present invention is generally related to flash memory systems. More particularly, the invention relates to a compact flash controller that manages a set of compact flash memory modules used as a storage device, and/or an external memory device having a flash memory as a storage medium.

2. Description of the Related Art

Many of the smaller electronic devices and systems such as digital cameras, MPEG portable music system, and personal data assistants are now being configured with memory designed to store both data and applications content captured by these devices. One advantage of having memory in such devices is that the captured data or application content can be eventually downloaded to a host system at a subsequent time. For example, a digital camera captures an array of images and stores them in memory to be downloaded to an image or graphics application program running on a computer system that coverts the captured images into high-resolution photographs that can be incorporated in newspaper and magazine articles or a presentation.

Typically, these devices employ a non-volatile, readable/writable storage device that requires very little, if any, power to retain its content. This solid state or semiconductor data storage system, commonly referred as a flash memory is a card that incorporates a controller, plurality of flash memory modules or arrays, and a PCMCIA interface that provides the required connectivity to an electronic device or system. Each module includes a number of flash memory cells that are organized in a set of independently erasable blocks. The controller performs the fundamental operation of read, write, and block erase to stores either data or application content in one or more memory locations and then recalls the stored data or application content, upon request, for output to an external device or system. Unlike other forms of memory or mass storage, the amount of time necessary to perform a write data or program bit and erase can be significant. Nevertheless, for a number of applications, the advantages of low power, ruggedness, portability and smaller size of a flash memory system makes it a reasonable alternative to other data storage devices.

FIG. 1 is a block diagram illustrating a typical flash memory controller as implemented in the prior art. FIG. 1 shows that the flash memory controller 104 comprises a host interface 110 that includes a host multiplexer 116, a buffer manager 112 that has a buffer multiplexer 118, and a flash memory formatter 114 comprising a flash memory sequencer 120 and an ECC process circuit 122 to perform error correction. The host interface 110 transfers data, commands and or application content to and from the host computer 102. The host multiplexer 116 operates on time division basis to convert the received data, commands or application content in a sixteen bit format into an eight bit format prior to it being stored in one or more flash memory arrays 108. In addition, the host multiplexer 116 converts the data, commands or application content retrieved from flash memory 108 into a sixteen bit data stream so it can be transmitted back to the host computer 102 for processing.

As shown by FIG. 1, the flash memory controller 104 uses an external buffer 106 to execute all of the read/write operations between the host system 102 and the flash memory 108. Thus, when data is to be written to flash memory 108, the data, commands or application content received from the host computer 102 is converted from a sixteen bit to a eight bit data stream by the host interface 110 and is then placed in the external data buffer 106 by the buffer memory manager 112. Once stored in the buffer 106, the data is directed through the buffer memory multiplexer 118 of the buffer manager 112 to the flash memory formatter 114. The flash memory sequencer 120 controls an access process of writing to and or reading from one or more sectors of the flash memory 108. Under program control, the flash memory sequencer 120 transfers data or application content, via an eight-bit bus, to and from one or more sectors of the flash memory 108. As described above, all data movement or transfer functions between the host system 102 and the flash memory 108 must pass through the buffer multiplexer 118 and external buffer 106. This is due to the fact that the transfer rate of flash memory 108 is much slower than that of host computer 102. In other words, in order to perform either a write to, read from, or erase the contents function, the eight bit bus 124 between the flash memory controller 104 and flash memory 108 is occupied for a substantial period of time. Here, the external buffer 106 is used to equalize the differences in the transfer rate between the host system 102 and flash memory 108 by allowing data or application content to be transmitted to and received from host computer 102 more efficiently.

The problem with this approach is that it takes twice as long to transfer data or applications content in or out of flash memory 108 when all data transfer functions must be passed through the buffer manager 112 as well as in and out of the external buffer 106. By using an external buffer each and every time to perform a write cycle or read cycle via the buffer, it reduces the overall performance of the flash memory controller. In addition, a flash memory controller of this type is limited to transmitting the stored commands, data or application content through a single input-output interface. As a result, electronic devices that incorporate such a mechanism are only able to download data to external sources through the host interface. Hence, an external source such as a digital camera, MPEG portable player, or personal data assistant that receives the stored data and or application content via a flash memory system with this type of controller has to have the same or similar interface to receive the data from the memory.

Hence, there is a need for a compact flash memory controller that can be constructed at a cost comparable to that of currently available flash memory modules. In addition, the needed compact flash memory controller should incorporate and support other capabilities in a manner that would allow for simple transmission of data stored in the flash memory via one or more industry standard I/O interfaces. The needed compact flash controller should utilize interface to a variety of different devices in a variety of configurations such as a PCMCIA-ATA and IDE modes. Each of these modes of operation requires different protocols. Upon initialization with an interface device, this needed compact flash controller should automatically detect which operation mode is used by this interface device and configure the memory card to be compatible with its operation.

SUMMARY OF INVENTION

An object of the present invention is to provide a new and improved compact flash memory controller by overcoming at least some of the disadvantages and limitations of flash memory controller as implemented in the prior art.

It is also an object of the present invention to provide a compact flash controller that provides a means for writing to and reading data from a plurality of flash memory modules with improved throughput characteristics.

The above and other objects are attained by a compact flash memory controller in accordance with this invention for controlling transfer of data between flash memory and a host device comprising:

A PCMCIA-ATA flash memory interface, an IDE interface, a microcontroller, a ROM memory for program storage, a RAM memory for program execution and to maintain a set of command and attribute registers used by the microcontroller to manage the data transfer operation in and out of a plurality of flash memory, a buffer manager for temporarily storing data to be transferred to and from flash memory, a flash memory sequencer for controlling the transfer of a data to and from flash memory that has been received from the buffer manager and a data bus couple to the set of operative components that include the microcontroller, the PCMCIA-ATA flash memory interface, the IDE interface, the ROM memory, the RAM memory and the buffer manager.

BRIEF DESCRIPTION OF THE DRAWINGS

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

The present invention now will be described more fully with reference to the accompanying drawings, in which the preferred embodiments of the invention are shown. The present invention may, however, embodied in many different forms and should not be construed as limited to the embodiment set forth herein; rather these embodiments are provided so that this disclosure will be thorough and complete and will fully convey the invention to those skilled in the art.

Figure 1:
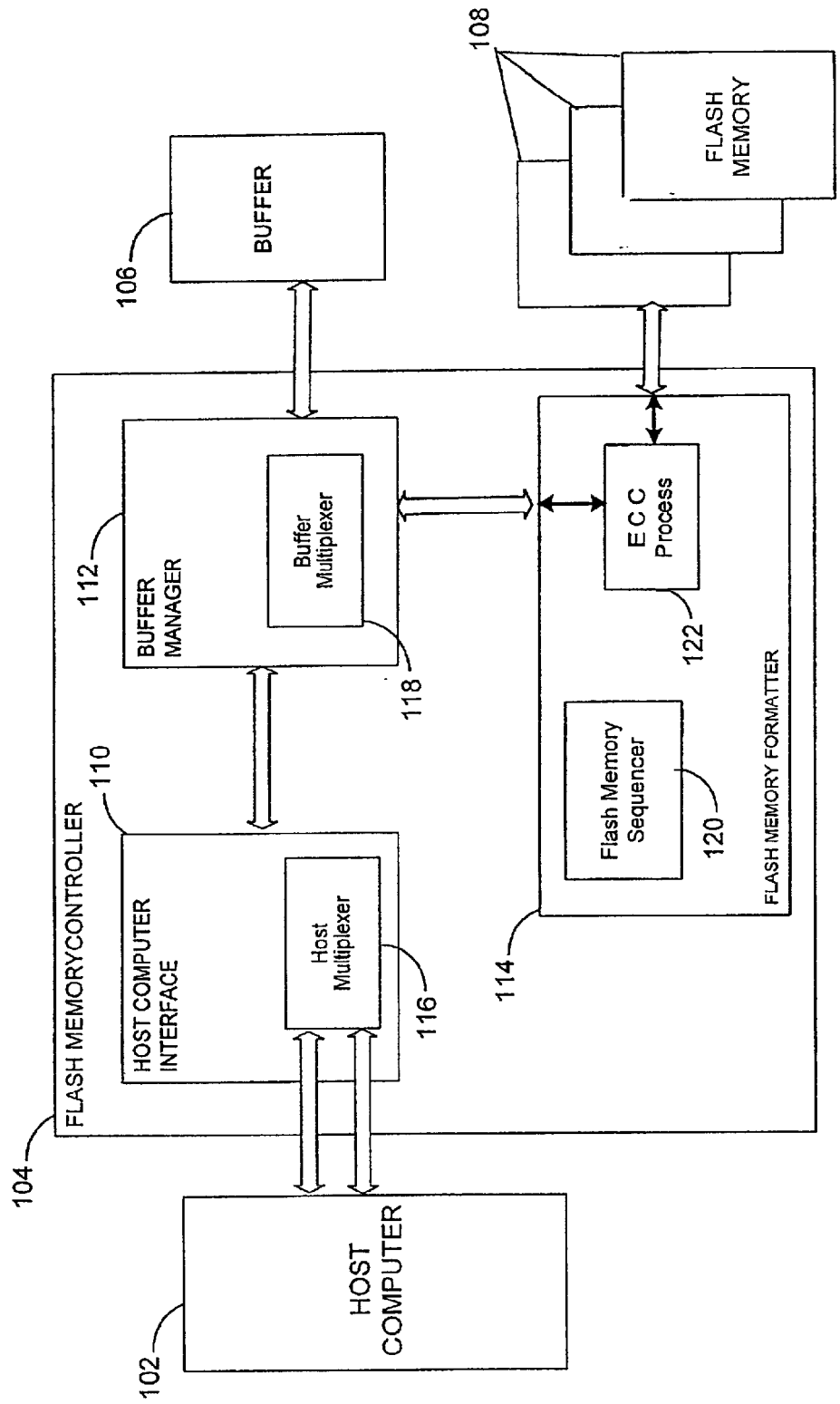
FIG. 1 is a block diagram illustrating a typical flash memory controller as implemented in the prior art.
Figure 2:
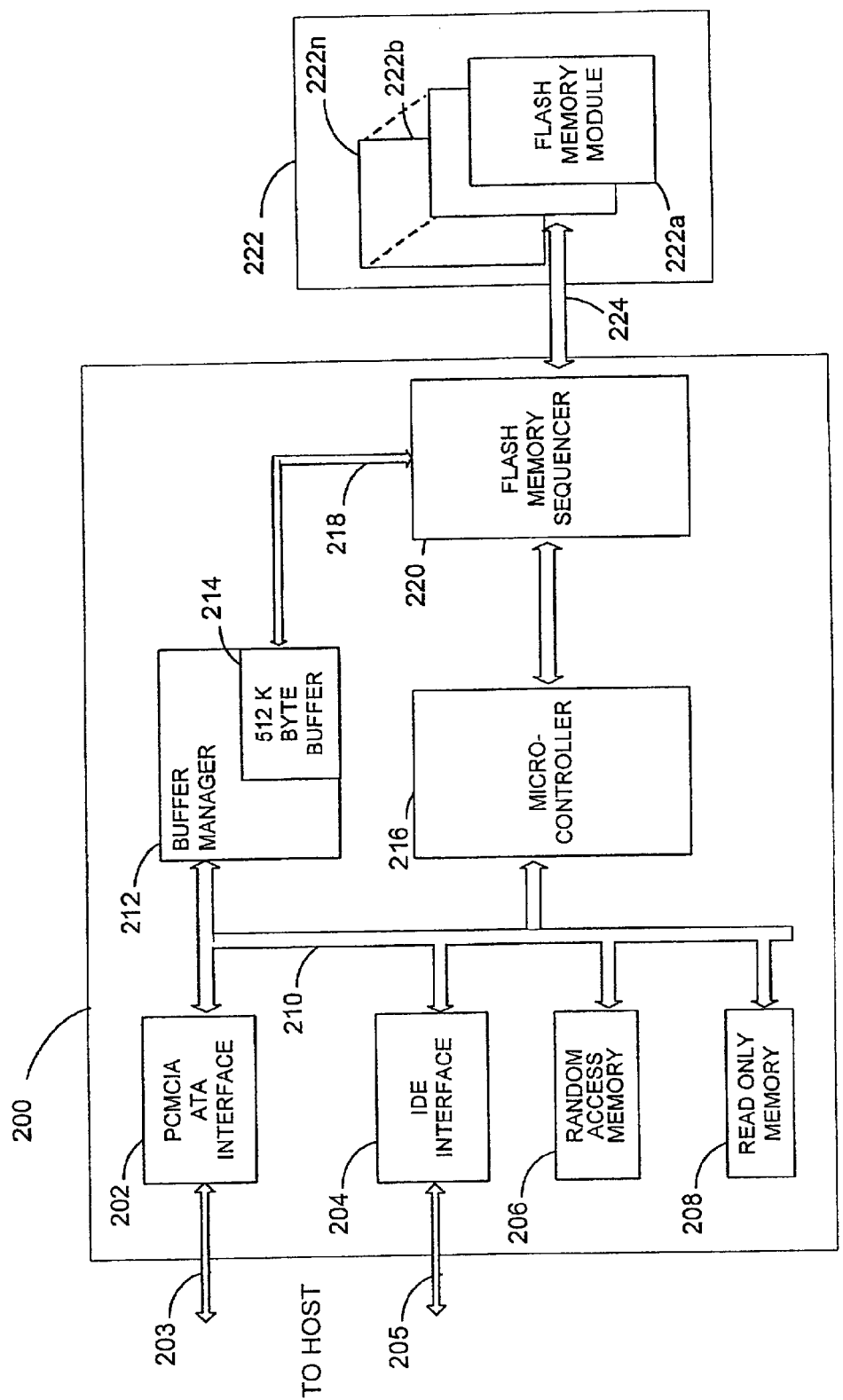
FIG. 2 is a block diagram illustrating the operative components of a compact flash controller in accordance with the present invention.

The invention will now be described with respect to FIG. 2, which illustrates the operative components of a compact flash controller 200 in accordance with the present invention. FIG. 2 shows flash memory 222 consisting of a plurality of NAND type flash memory modules 222a–222n is connected, via data bus 224, to compact flash controller 200 that manages all of the data transfer operation in and out of flash memory 222. For purposes of this embodiment, compact flash memory controller 200 specifically directs data to be stored to a pair of flash memory modules 222a and 222b. Flash memory module 222a store the odd data segment of a received data word while flash memory module 222b stores the remaining even bit data segment of the data word. Thus, a data word received from a host device is parsed into an odd data segment that is written to and stored in flash memory modules 222a and an even data segment is written to and stored in flash memory module 222b.

As FIG. 2 shows the compact flash controller 200 includes a PCMCIA-ATA interface 202, an IDE interface 204, random access memory 206, ROM memory 208 used for program storage, a buffer manager 212 and a microcontroller 216 that are interfaced to a high-speed data bus 210. Here, either the PCMCIA-ATA interface 202 or the IDE Interface can transmit to or receive data, addresses and an array of control signals from a host or external device through either bidirectional data interface 203 or 205, respectfully. For the purposes of this embodiment, data received from the host device is then transferred by the PCMCIA-ATA interface 202 across high-speed bus 210 to be stored in the buffer 214 of buffer manager 212. Once the data word received from the PCMCIA-ATA interface 202, it is parsed into an even data segment and an odd segment that is temporarily stored in the buffer 214 of the buffer manager 212.

FIG. 2 also shows that the buffer manager 212 is directly connected via a separate data interface 218 to a flash memory sequencer 220. Under program control, the microcontroller 216 directs the buffer manager 212 to sequentially move both the each data segment or sector stored in buffer 214 through a FIFO like data register (first-in/first-out) of the buffer manager and buffer 212 and across the attached data interface 218 to the flash memory sequencer 220. Upon receipt of the two data strings by flash memory sequencer 220, an ECC error correction procedure is performed prior to being processed and written to flash memory 222. This allows errors, that would normally cause a problem, to be detected and corrected without effecting the operation of the system. Once the ECC error correction process is complete, the flash memory sequencer 220 then transfers the both odd and even data segments as well as the associated error correction code via a flash memory data interface 224 to flash memory module 222a and flash memory module 222b, respectfully.

When data is read from flash memory 222, the requested odd and even data segments are transferred from flash memory module 222a and flash memory module 222b, respectfully across the flash memory data interface 224 to the flash memory sequencer 220. The data segments are then moved to the buffer 214 of the buffer manager and 212 where they are concatenated into a complete data word that can be transferred back to the host either through the PCMCIA-ATA interface 203 or the IDE Interface 204.

Figure 3A:
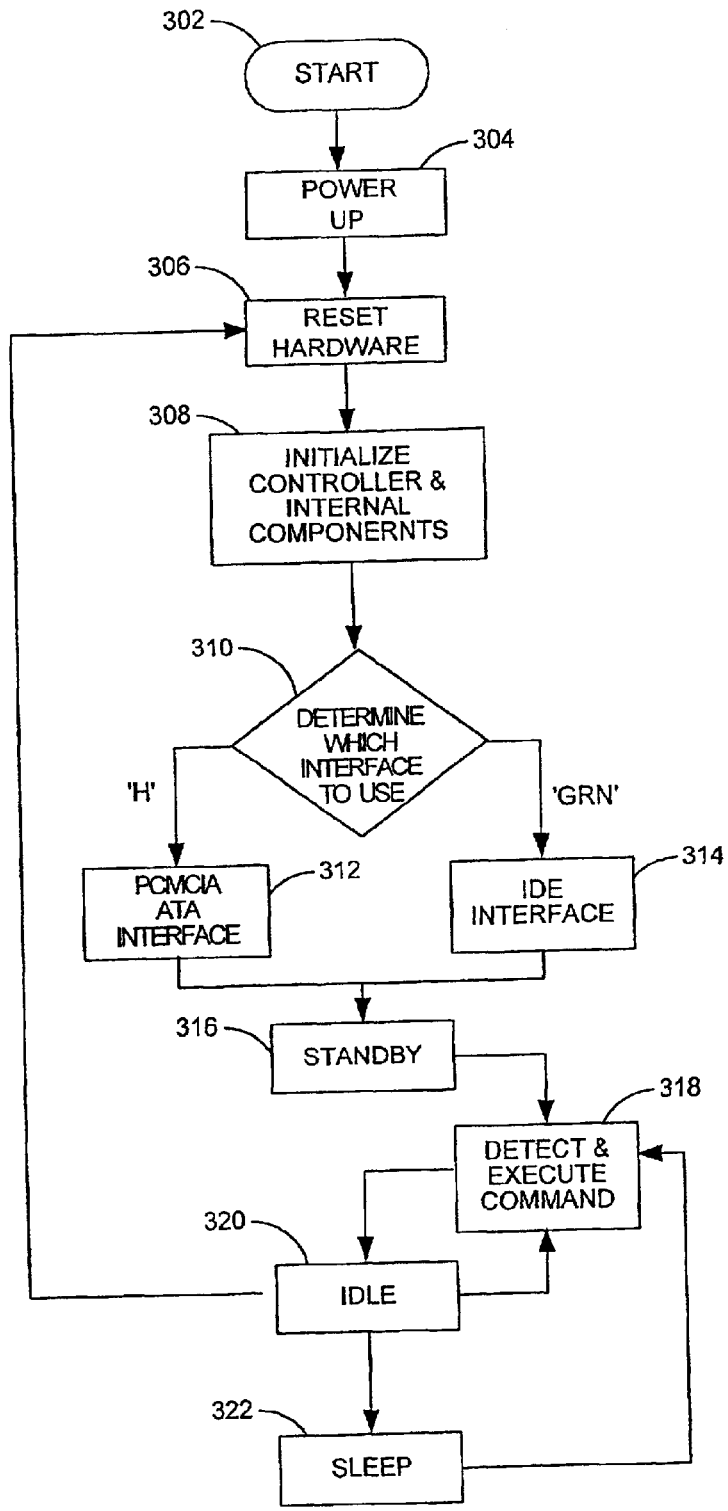
FIG. 3 is an exemplary flow chart illustrating the flow of events performed by the compact flash controller in accordance with FIG. 2.

FIG. 3 is a flowchart that illustrates the flow of events performed by the compact flash controller in accordance with FIG. 2. The steps in the flowchart are simply illustrative of the functional steps performed by the by the compact flash controller 200, however, a person of ordinary skill in the art will appreciate that the exact sequence of operation by the compact flash controller 200 to perform the functions described in the flowchart of FIG. 3 may vary. Reference is now to FIGS. 3a of flowchart illustrating the steps performed by the compact flash controller to manage data transfers in and out of flash memory 222. As FIG. 3a shows at steps 302, 304 and 306, the host device is powered up, a card is detected and at step 308, the compact flash controller 200 and all internal components are initialized as well as the ready bit (RDY) in the status register is cleared. At step 310, the controller determines which interface is to be used by detecting whether the OE/ATSEL is high (H) or at ground (L or GRD). If the OE/ATSEL signal is high (H) the PCMCIA-ATA is selected but if the OE/ATSEL is low (L) or at ground (GND) the IDE interface is selected. Once the interface has been selected, the controller, at step 316, waits. When a "command in" signal is detected, at step 318, the controller selects and performs the appropriate operative sequence that relates to that command. Once the command has been executed, the controller, at step 320, waits for either a software reset or to receive a command from the host or external device. If either the software reset or a new "command in" signal does not occur in a predetermined time period, the controller, in step 322, goes to sleep.

Figure 3B:
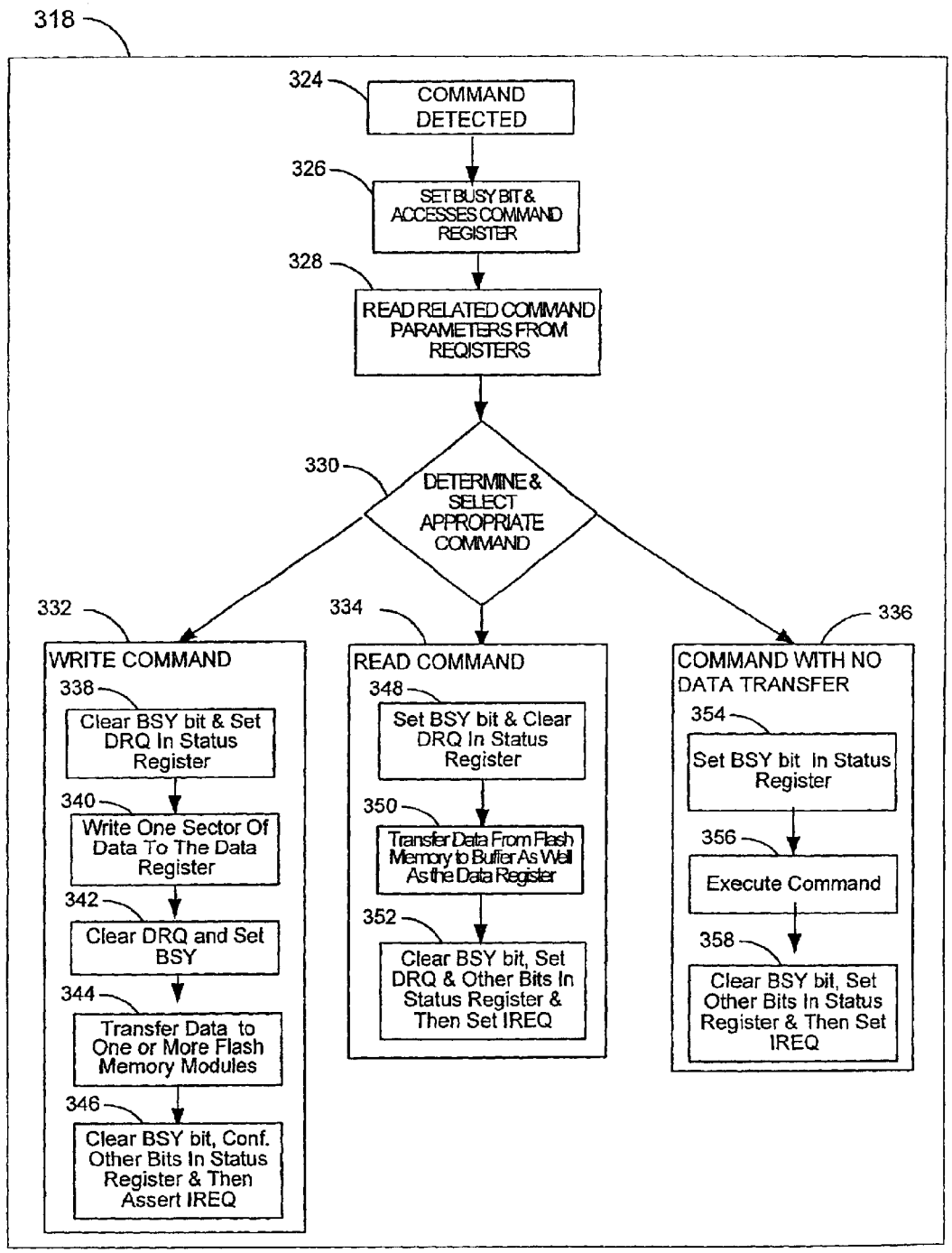

FIG. 3b is a detailed flow of event preformed by the compact flash controller to execute the fundamental commands to transfer data or applications content in or out of flash memory 222. As shown, at step 324, the compact flash controller detect the type of command requires execution and at step 326 sets the busy bit (BSY) in the status register and accesses the command register. Then, at step 328, the related command operational functions or parameters are read from a set of registers that include features, sector number, sector count, cylinder 'Hi', cylinder 'low' and drive head. Once these registers have been read, at step 330, the compact flash controller selects the appropriate command.

As FIG. 3b shows the compact flash controller can execute three types of command sequences; a write command 332, a read command 334 or a command with no data transfer. If, at step 330, a write command has been selected, the controller, in step 338, clears the busy bit (BSY) as well as sets the data reset query bit in the status register. A data segment or sector, in step 340, is written into the FIFO like data register. The compact flash controller, in step 342, then clears the DRQ bit and sets the busy bit (BSY) indicating it is in the process of executing a data transfer operation. The controller, in step 344, transfers the data segment or sector from the data register via the flash memory sequencer and writes the data segment or sector to at least one flash memory module. In step 346, the busy bit (BSY) is cleared; the IREQ is asserted indicating that the write operation is complete and controller is idle and, in step 320 (shown in FIG. 3a), is ready for the next "command in" operation.

As FIG. 3b also shows the steps of transferring a data segment or sector from the flash memory through either the PCMCIA-ATA interface or the IDE interface flash to a connected host device. If, at step 334, a read command is selected, the controller, in step 348, sets the busy bit (BSY) and clears the data reset query bit in the status register. A data segment or sector, in step 350, is read from flash memory and placed in the buffer, then into an outbound FIFO like data register and transferred through the appropriate interface to the attached host device. The compact flash controller, in step 352, set the DRQ bit and clears the busy bit (BSY) indicating it has executed the data transfer operation and in step 320 (shown in FIG. 3a), is standing for the next "command in" operation.

The last command type shown in FIG. 3b is the steps performed for a command that does not include a data transfer. If, at step 336, a command with no data transfer is detected by the controller, in step 354, sets the busy bit (BSY) in the status register and then, in step 356, executes the command. The compact flash controller, in step 358, then clears the busy bit (BSY), sets other bits in status register indicating it has executed the command and in step 320 (shown in FIG. 3a), is standing for the next "command in" operation.

An alternative embodiment of the compact flash controller replaces the IDE interface 206 with a multi-function interface that is comprised of any of a number of interfaces, including modem interfaces, serial I/O, parallel I/O, ISDN interfaces, twisted pair interfaces, fiber interfaces and IRDA interfaces, for example. Hence, the microcontroller 216 is capable of retrieving data that is stored in the flash memory 222 in the usual manner and, instead of outputting this data the PCMCIA-ATA interface 204, the microcontroller 216 can route this data to a multi-function interface that outputs the data on an output bus that is configured for either serial I/O, parallel I/O. When the compact flash controller and flash memory are installed, in the form of a card, in a small electrical device such as a camera, MPEG digital player, a handheld portable computer, a PDA or the like, the microcontroller 216 can be configured to output the data either via the ATA flash interface or via the alternate interface. Further, the multi-function interface can be configurable as a result of the alternate function commands and codes stored within one of the flash memory modules 222a–222n. This greatly enhances the flexibility in interfacing an electronic device incorporating flash memory modules with external devices as the electronic devices which incorporate a compact flash memory module of the preferred embodiment can be interfaced to other small electronic devices that do not typically include an ATA flash interface.

While the foregoing detailed description has described several embodiments of the compact flash controller in accordance with this invention, it is to be understood that the above description is illustrative only and not limiting of the disclosed invention. Particularly, used in a compact flash memory card, the compact flash controller automatically detects which operational mode is used for the attached interface device and configures the memory card to perform the necessary data transfers in accordance with that operation mode. Thus, the compact flash controller allows the memory card to operate in either the PCMCIA mode, or the ATE IDE mode. These operating modes are merely exemplary. The compact flash controller can be configured to automatically detect and operate in additional operating modes and with additional interfaces. It will be appreciated that the embodiments discussed above and the virtually infinite embodiments that are not mentioned could easily be within the scope and spirit of this invention. Therefore, the invention is to be limited only by the claims as set forth below.

What is claimed is:

1. A compact flash memory controller for controlling transfer of data between flash memory and a host device comprising:

a PCMCIA-ATA flash memory interface;

an IDE interface;

a microcontroller a ROM memory for program storage;

a RAM memory for program execution and to maintain a set of command and attribute registers used by the microcontroller to manage the data transfer operation in and out of a plurality of flash memory;

a buffer manager for temporarily storing data to be transferred to and from flash memory, the buffer manager including an integrated data interface attached to the flash memory sequencer so that data segments or sectors can be moved to and from the flash memory sequencer;

a flash memory sequencer for controlling the transfer of a data to and from flash memory that has been received from the buffer manager; and a data bus couple to the set of operative components that include the microcontroller, the PCMCIA-ATA flash memory interface, the IDE interface, the ROM memory, the RAM memory and the buffer manager.

2. The compact flash controller as recited in claim 1, wherein the buffer manager further comprises an integrated data buffer to receive and store data as a least sixteen bit format.

3. The compact flash controller as recited in claim 1, wherein the integrated data buffer is at least 512 kilobyte in size.

4. The compact flash controller as recited in claim 1, wherein the data bus transports data, addresses and commands between the operative components of the controller and the host device.

5. The compact flash controller as recited in claim 1, said flash memory sequencer comprises a counter, a sequencer RAM which stores instructions at an address which is indicated by said counter, an instruction decoder coupled with said sequencer RAM for decoding a instruction so that a decoded micro order is sent to a flash memory chip through said data bus, and a decision circuit which adjusts content of said counter depending upon an output of said AND circuit.

6. The compact flash controller as recited in claim 1, wherein the integrated data interface attached to the buffer manager is directly interfaced to the flash memory sequencer where data from the buffer can move from a buffer location to the flash memory sequence, in parallel and without program intervention.

7. The compact flash controller as recited in claim 1, wherein the compact flash controller can access a plurality of flash memory modules.

8. The compact flash controller as recited in claim 7, wherein the flash memory modules are grouped in a two module set, one that stores odd bit data segments or sectors and the other that stores even bit data segments or sectors.

9. The compact flash controller as recited in claim 7, wherein each flash memory module have a plurality of data and address elements that are least 8 bits wide.

10. A flash memory system coupled with a host device comprising:

a flash memory, and a compact flash controller for controlling data transfers between flash memory and a host device, where the compact flash controller includes:

a PCMCIA-ATA flash memory interface;

an IDE interface;

a microcontroller a ROM memory for Program storage;

a RAM memory for program execution and to maintain a set of command and attribute registers used by the microcontroller to manage the data transfer operation in and out of a plurality of flash memory;

a buffer manager for temporarily storing data to be transferred to and from flash memory;

a flash memory sequencer for controlling the transfer of a data to and from flash memory that has been received from the buffer manager; and a data bus couple to the set of operative components that include the microcontroller, the PCMCIA-ATA flash memory interface, the IDE interface, the ROM memory, the RAM memory and the buffer manager; and access to a plurality of flash memory modules and the flash memory modules are grouped in a two module set, one that stores odd bit data segments or sectors and the other that stores even bit data segments or sectors.

11. The flash memory system as recited in claim 10, wherein each flash memory module have a plurality of data and address elements that are least 8 bits wide.

* * * * *